(12) United States Patent
Kondo

(10) Patent No.: US 10,332,992 B1
(45) Date of Patent: Jun. 25, 2019

(54) SEMICONDUCTOR DEVICE HAVING IMPROVED TRENCH, SOURCE AND GATE ELECTRODE STRUCTURES

(71) Applicants: SANKEN ELECTRIC CO., LTD., Niiza-Shi, Saitama (JP); Polar Semiconductor, LLC., Bloomington, MN (US)

(72) Inventor: Taro Kondo, Niiza (JP)

(73) Assignees: SANKEN ELECTRIC CO., LTD., Niiza-shi (JP); Polar Semiconductor, LLC., Bloomington, MN (US)

( * ) Notice: Subject to any disclaimer, the term of this patent is extended or adjusted under 35 U.S.C. 154(b) by 0 days.

(21) Appl. No.: 15/876,269

(22) Filed: Jan. 22, 2018

(51) Int. Cl.
*H01L 29/78* (2006.01)
*H01L 29/10* (2006.01)
*H01L 29/40* (2006.01)
*H01L 29/423* (2006.01)

(52) U.S. Cl.
CPC ...... *H01L 29/7813* (2013.01); *H01L 29/1095* (2013.01); *H01L 29/407* (2013.01); *H01L 29/4236* (2013.01); *H01L 29/42364* (2013.01); *H01L 29/42376* (2013.01)

(58) Field of Classification Search
CPC ............. H01L 29/7813; H01L 29/1095; H01L 29/407; H01L 29/4236; H01L 29/42364; H01L 29/42376
See application file for complete search history.

(56) References Cited

U.S. PATENT DOCUMENTS

| | | | | |
|---|---|---|---|---|
| 7,750,397 B2* | 7/2010 | Hirler | ............... | H01L 29/0634 257/328 |
| 7,858,478 B2* | 12/2010 | Hirler | ............... | H01L 21/2815 438/270 |
| 8,502,315 B2* | 8/2013 | Mauder | ............... | H01L 29/407 257/341 |
| 8,664,065 B2* | 3/2014 | Grivna | ............... | H01L 29/407 438/270 |
| 9,166,027 B2* | 10/2015 | Sandow | ............. | H01L 29/7393 |
| 9,324,800 B1* | 4/2016 | Ku | ................... | H01L 29/66666 |
| 9,748,378 B2* | 8/2017 | Koepp | .............. | H01L 29/7825 |
| 9,761,676 B2* | 9/2017 | Henson | ................ | H01L 29/407 |
| 9,917,186 B2* | 3/2018 | Laven | ................ | H01L 29/4236 |
| 9,960,268 B2* | 5/2018 | Zundel | .............. | H01L 29/0878 |

(Continued)

FOREIGN PATENT DOCUMENTS

JP 2013-065774 A 4/2013

*Primary Examiner* — Ida M Soward

(74) *Attorney, Agent, or Firm* — Metrolexis Law Group, PLLC

(57) ABSTRACT

A semiconductor device according to one or more embodiments may include: a drain region; a drift region positioned above the drain region; a base region positioned on the drift region; a trench positioned to abut the base region and the drift region; an insulating in the trench; a counter electrode embedded in the insulating film; a gate electrode positioned above the counter electrode and that is embedded in the insulating film; and a source region that abuts the base region and the trench, wherein a thickness of the insulating film between the gate electrode and an interface between the drift region and the base region is larger than a thickness of the insulating film between the gate electrode and an interface between the source region and the base region.

16 Claims, 4 Drawing Sheets

(56) References Cited

U.S. PATENT DOCUMENTS

| | | | |
|---|---|---|---|
| 2010/0019316 A1* | 1/2010 | Pattanayak | H01L 29/407 257/330 |
| 2013/0069147 A1* | 3/2013 | Ohta | H01L 29/7813 257/330 |
| 2013/0146970 A1* | 6/2013 | Hirler | H01L 27/0255 257/334 |
| 2013/0153995 A1* | 6/2013 | Misawa | H01L 29/407 257/330 |
| 2013/0154000 A1* | 6/2013 | Shinbori | H01L 29/407 257/334 |
| 2013/0221498 A1* | 8/2013 | Hayashi | H01L 29/41766 257/655 |
| 2013/0248987 A1* | 9/2013 | Okuhata | H01L 29/407 257/330 |
| 2013/0248991 A1* | 9/2013 | Yilmaz | H01L 29/7827 257/330 |
| 2013/0302958 A1* | 11/2013 | Hossain | H01L 29/66348 438/270 |
| 2013/0307062 A1* | 11/2013 | Meiser | H01L 29/42392 257/330 |
| 2013/0323921 A1* | 12/2013 | Burke | H01L 21/02164 438/589 |
| 2014/0084362 A1* | 3/2014 | Schloesser | H01L 29/66734 257/330 |
| 2014/0264571 A1* | 9/2014 | Lui | H01L 29/407 257/330 |
| 2015/0021685 A1* | 1/2015 | Matsuoka | H01L 29/407 257/330 |
| 2015/0054068 A1* | 2/2015 | Grivna | H01L 29/7842 257/331 |
| 2015/0069610 A1* | 3/2015 | Grivna | H01L 29/66348 257/741 |
| 2015/0115351 A1* | 4/2015 | Wutte | H01L 29/1095 257/328 |
| 2016/0247916 A1* | 8/2016 | Stefanov | H01L 27/088 |
| 2016/0351668 A1* | 12/2016 | Schwetlick | H01L 29/42368 |
| 2016/0351703 A1* | 12/2016 | Matsuura | H01L 29/78 |

\* cited by examiner

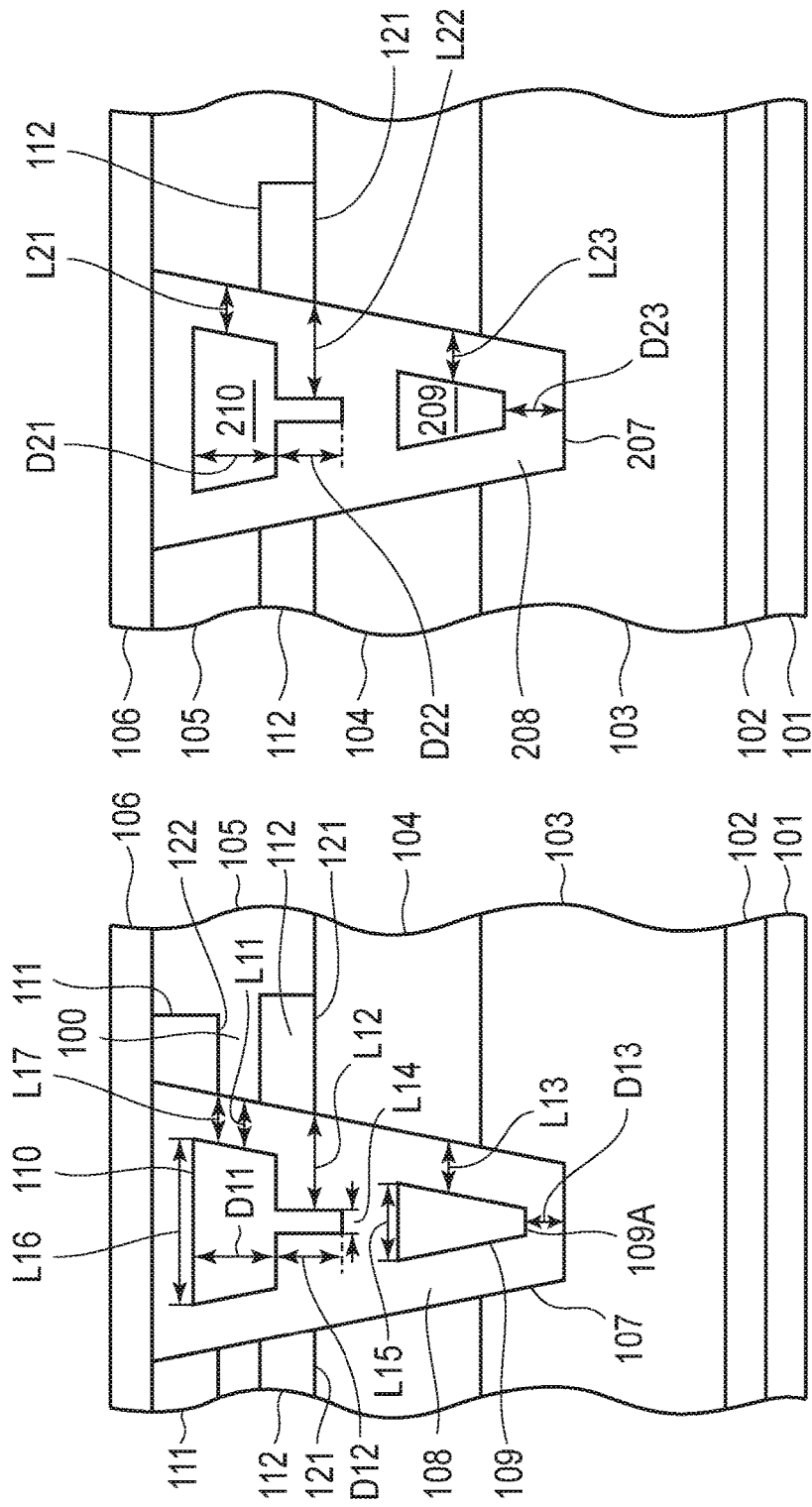

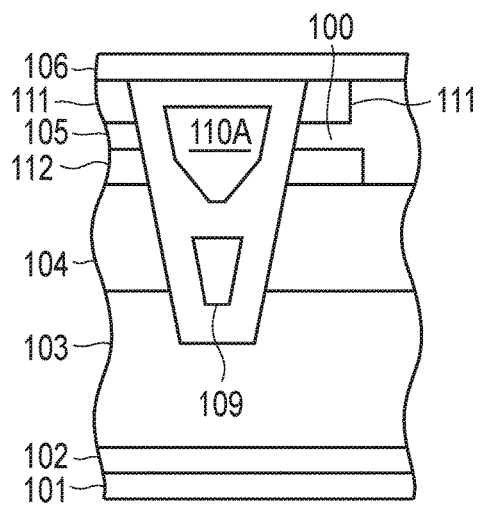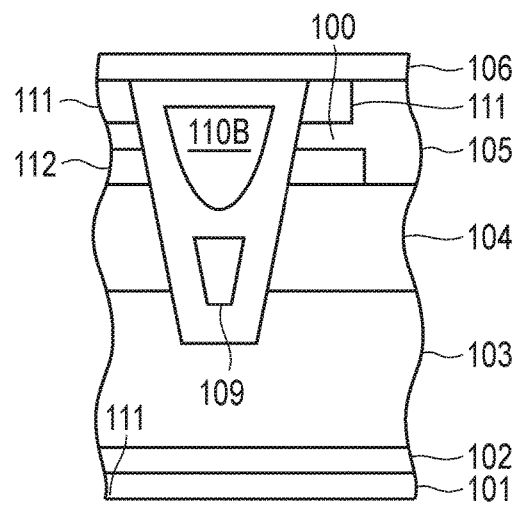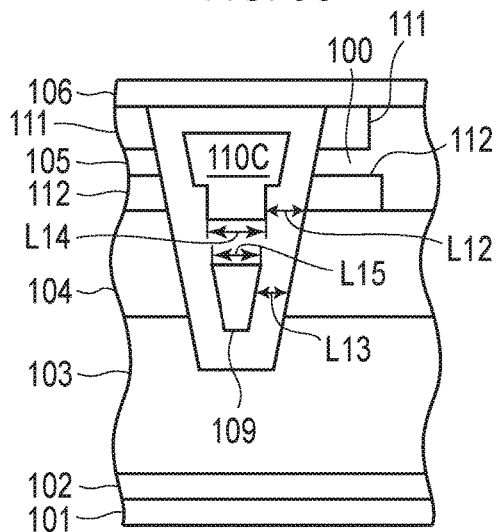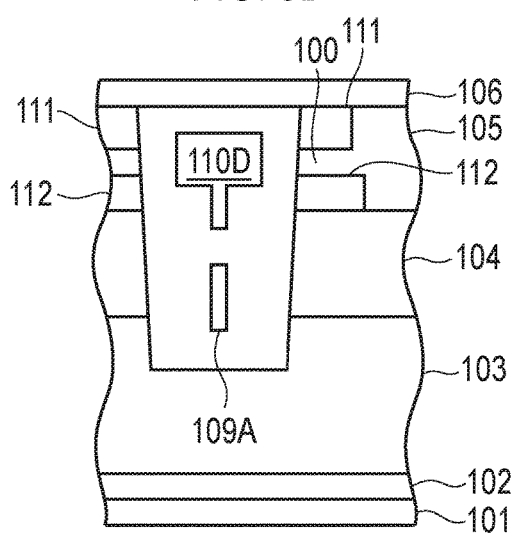

SEMICONDUCTOR DEVICE HAVING IMPROVED TRENCH, SOURCE AND GATE ELECTRODE STRUCTURES

BACKGROUND

The disclosure is generally related to a semiconductor device, and specifically to a semiconductor device having a trench gate structure.

Japanese Patent Application Publication No. 2013-065774 (Prior art document 1) discloses a metal oxide semiconductor (MOS) transistor including trenches. The MOS transistor includes the trenches 20 which penetrate an N-type source region 13 and a P-type base region 12 and terminate in an N-type drift region 11. A gate electrode 26 is provided in each trench 20 with an insulating film 25 provided between the gate electrode 26 and a side wall of the trench 20. With the reduction of the trench width and the intervals between adjacent trenches, the number of gate electrodes in a unit area increases in the trench MOS transistor. The trench MOS transistor achieves reduction of on-resistance.

In the MOS transistor disclosed in the prior art document 1, a depletion layer spreads from a PN interface between the N-type region 11 and the P-type region 12 when the transistor is off. Since the depletion layer does not spread beyond the N-type region 11, an electric field concentrates near a corner of a bottom portion of each trench 20. Accordingly, a counter electrode with a floating potential or a potential electrically connected to a source electrode is provided below the gate electrode to suppress electric field concentration near the corner of the bottom portion of the trench 20.

SUMMARY

A semiconductor device according to one or more embodiments may include: a drain region; a drift region positioned above the drain region; a base region positioned on the drift region; a trench positioned to abut the base region and the drift region; an insulating in the trench; a counter electrode embedded in the insulating film; a gate electrode positioned above the counter electrode and that is embedded in the insulating film; and a source region that abuts the base region and the trench. In one or more embodiments, a thickness of the insulating film between the gate electrode and an interface between the drift region and the base region may be larger than a thickness of the insulating film between the gate electrode and an interface between the source region and the base region.

A semiconductor device according to one or more embodiments may include: a drain region; a drift region positioned on the drain region; a base region positioned on the drift region; a trench positioned to abut the base region and the drift region; an insulating film in the trench; a counter electrode embedded in the insulating film; a gate electrode positioned above the counter electrode and that is embedded in the insulating film; and a source region that abuts the base region and the trench. In one or more embodiments, a thickness of the insulating film in a portion facing the deepest region of the interface between the base region and the drift region may be larger than a thickness of the insulating film in a portion facing the interface between the base region and the source region.

A semiconductor device according to one or more embodiments may include: a drain region; and a drift region positioned on the drain region; a base region positioned on the drift region; a trench positioned to abut the base region and the drift region; an insulating film in the trench; a counter electrode embedded in the insulating film; a gate electrode positioned above the counter electrode and that is embedded in the insulating film; and a source region that abuts the base region and the trench, wherein a thickness of the insulating film between the gate electrode and an interface between the drift region and the base region is larger than a thickness of the insulating film in a portion facing a channel region.

BRIEF DESCRIPTION OF DRAWINGS

The accompanying drawings, which are incorporated herein and constitute part of this specification, illustrate exemplary embodiments of the invention, and together with the general description given above and the detailed description given below, serve to explain the features of the invention;

FIG. 2A is a diagram illustrating a cross-sectional view of a trench in an inner active portion of the semiconductor device and FIG. 2B is a diagram illustrating an edge trench in an outermost edge portion of the semiconductor device and structures around the edge trench according to one or more alternative or additional embodiments;

FIGS. 3A, 3B, 3C and 3D are diagrams illustrating a cross-sectional view of a trench configuration of an integrated power semiconductor device having an improved trench depth, a gate electrode and a source electrode according to one or more alternative or additional embodiments.

DETAILED DESCRIPTION

Figure 1:
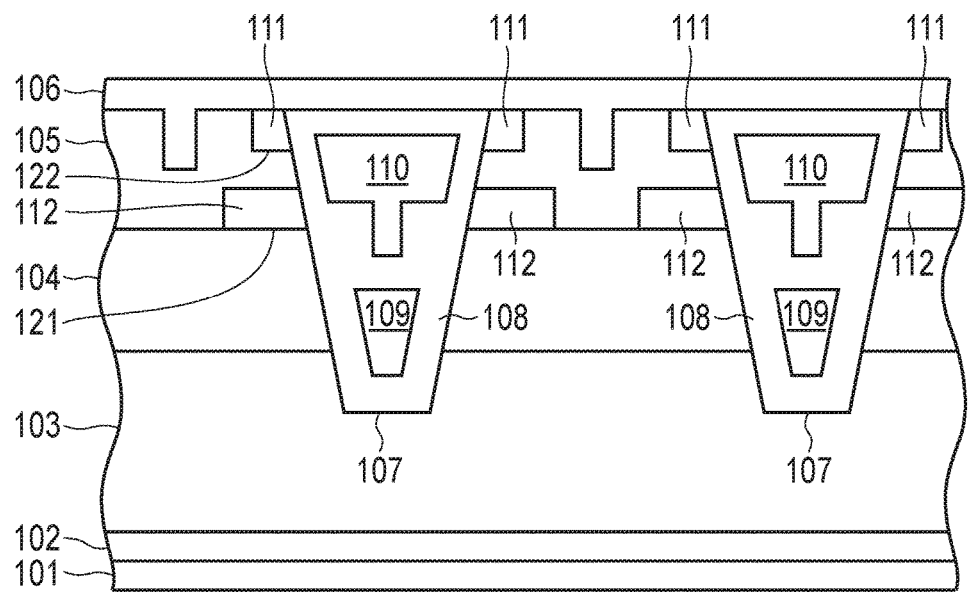
FIG. 1 is a diagram illustrating a cross-sectional view of a trench configuration of an integrated power semiconductor device having an improved trench depth, a gate electrode and a source electrode according to one or more embodiments.

One or more embodiments are described with reference to drawings. the same constituents are designated by the same reference numerals and duplicate explanation concerning the same constituents may be omitted for brevity and ease of explanation. The drawings are illustrative and exemplary in nature and provided to facilitate understanding of illustrated embodiments and may not be exhaustive or limiting. Dimensions or proportions in the drawings are not intended to impose restrictions on disclosed embodiments. For this reason, specific dimensions and the like should be interpreted with the accompanying descriptions taken into consideration. In addition, the drawings include parts whose dimensional relationship and ratios are different from one drawing to another.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

FIG. 1 is a cross-sectional view of a semiconductor device according to one or more embodiments. The semiconductor device includes a drain electrode 101, a drain region 102 provided on the drain electrode 101, a first drift region 103 provided on the drain region 102, a second drift region 104 provided on the first drift region 103, a first base region 105 provided on the second drift region 104, a source electrode 106 provided on the first base region 105, trenches 107 formed to abut the first base region 105, the second drift region 104, and the first drift region 103, an insulating film 108 provided in the trenches 107, counter electrodes 109 insulated from outside of the trenches 107 by the insulating film 108, gate electrodes 110 provided above the counter electrodes 109 and insulated from the outside of the trenches 107 by the insulating film 108, source regions 111 abutting the first base region 105 and the trenches 107, and second base regions 112 abutting the first base region 105 and the trenches 107.

The drain region 102, the first drift region 103, the second drift region 104, and the source regions 111 may be made of a first conductivity type semiconductor material. The drain region 102 may have a higher concentration of a first conductivity type impurity than the first drift region 103. Moreover, the first drift region 103 may have a lower concentration of the first conductivity type impurity than the second drift region 104. Alternatively, the concentration of the first conductivity type impurity may be the highest in the drain region 102, followed by the second drift region 104 and the first drift region 103. Moreover, although the semiconductor device in FIG. 1 includes the first drift region 103 and the second drift region 104, the semiconductor device 1 may include one drift region with a substantially uniform impurity concentration. Manufacturing the semiconductor device as such can facilitate a manufacturing process. The first conductivity type semiconductor material may be an N-type semiconductor material, and then the second conductivity type semiconductor material may be a P-type semiconductor material.

The semiconductor device illustrated in FIG. 1 includes the first drift region 103 and the second drift region 104. This structure contributes to reduction of on-resistance of the semiconductor device. The second drift region 104 has a relatively high concentration of impurity and a depletion layer is less likely to spread therein. However, since a portion of the insulating film facing a lower surface of each gate electrode near the second drift region 104 is thick, a sufficient level of withstanding voltage can be secured. Thus, it is possible to reduce the on-resistance of the semiconductor device while securing a sufficient level of withstanding voltage.

The semiconductor device illustrated in FIG. 1 includes the first base region 105 and the second base regions 112. In this structure, the second base regions 112 which are close to trench side walls 107C facing the thick insulating film 108 may have a lower concentration of impurity than the first base region 105 on the second base regions 112. In this case, the thick insulating film 108 is arranged between each of the gate electrodes 110 and the corresponding second base region 112, but setting the concentration of impurity in the second base region 112 to a low level allows formation of an excellent channel.

The first base region 105 and the second base regions 112 may be made of a second conductivity type semiconductor material. Moreover, although the semiconductor device in FIG. 1 includes the first base region 105 and the second base regions 112, the semiconductor device may include one base region with a substantially uniform impurity concentration. Manufacturing the semiconductor device as such can facilitate a manufacturing process.

Examples of the first conductivity type impurity include arsenic (As), phosphorus (P), and the like. Examples of the second conductivity type impurity include boron (B), boron fluoride ($BF_{2^+}$), and the like.

In each of the trenches 107, a trench surface portion 107A abutting the source electrode 106 is wider than a trench bottom portion 107B abutting the first drift region 103. In other words, the trench 107 gradually becomes narrower in a direction from the source electrode 106 toward the drain electrode. That is to say, the trench 107 is formed in a shape tapered in a depth direction of the semiconductor device.

As illustrated in FIG. 1, the semiconductor device may include the trenches 107. Each trench 107 may include therein the insulating film 108, the counter electrode 109, and the gate electrode 110.

Each of the trenches 107 illustrated in FIG. 1 may have the tapered shape and the side wall of the gate electrode 110 may be formed substantially parallel to the trench side wall 107C. Moreover, part of the side wall of the gate electrode may be formed substantially parallel to the trench side wall 107C.

FIGS. 2A and 2B are views for explaining configurations of the gate electrode and the counter electrode in each of trenches. FIG. 2A illustrates a trench in an inner active portion and FIG. 2B illustrates an edge trench in an outermost edge portion of the semiconductor device and structures around the edge trench.

A lower surface of the gate electrode 110 illustrated in FIG. 2A is located below a first PN junction 121 (for example, an interface between the second drift region 104 and the second base region 112), that is, the gate electrode 110 extends to the second drift region 104. The thickness L12 of the insulating film 108 between the gate electrode 110 and a portion where the first PN junction 121 abuts the trench 107 may be larger than the thickness L11 of the insulating film 108 in a portion facing a channel region 100. In the semiconductor device having such a structure, since the thickness of the insulating film on the trench side wall facing the corner of the lower portion of the gate electrode 110 is large, the electric field on the corner side of the gate electrode lower portion is reduced. Accordingly, it is possible to suppress breakdown at the corner of the gate electrode lower portion when voltage of a predetermined level or more is applied and to improve the breakdown voltage of the semiconductor device.

The width L14 of the lower surface of the gate electrode 110 may be smaller than the width L15 of an upper surface of the counter electrode 109. This structure can reduce the capacity between the gate electrode 110 and the counter electrode 109. The structure can reduce the capacity between the gate and the source of the semiconductor device particularly when the counter electrode 109 is electrically connected to the source electrode 106.

Moreover, the gate electrode 110 may include a large width portion including an upper surface of the gate electrode 110 and a small width portion including the lower surface of the gate electrode 110 and have a so-called T-shape in which the width of the large width portion is larger than that of the small width portion. Moreover, the large width portion and the small width portion may have rectangular shapes, trapezoidal shapes, or a combination of these. In other words, the gate electrode 110 may be such that the width L16 of the upper surface is larger than the width L14 of the lower surface and the width of the gate electrode 110 is reduced at a position on the second base region 112 side of the first PN junction 121 in the height direction. An interface between the large width portion and the small width portion may be provided above the first PN junction 121. In other words, the interface between the large width portion and the small width portion may be arranged at a position close to the second base region 112. This enables easy manufacturing of the structure. The length D11, in the depth direction, of the large width portion including the upper surface of the gate electrode 110 may be equal to or larger than the length D12, in the depth direction, of the small width portion including the lower surface of the gate electrode 110.

Furthermore, the thickness L12 of the insulating film at a portion where the first PN junction 121 abuts the trench 107 may be larger than the thickness L17 of the insulating film in a portion facing a second PN junction 122 (for example, an interface between the source region 111 and the first base region 105).

Moreover, an interface between the first drift region 103 and the second drift region 104 may be arranged below the lower surface of the gate electrode 110. Furthermore, the interface between the first drift region 103 and the second drift region 104 may be arranged below the upper surface of the counter electrode 109. Specifically, the gate electrode may be arranged at such a position that the gate electrode extends to the depth of the second drift region 104 but does not extend to the depth of the first drift region 103.

Moreover, a lower surface 109A of the counter electrode 109 may be arranged below the interface between the first drift region 103 and the second drift region 104. In other words, the counter electrode 109 may be arranged at such a position that the counter electrode 109 extends to the depth of the first drift region 103. Such arrangement allows corner portions of a trench bottom portion to be arranged in the first drift region 103 and the counter electrode 109 can cause the depletion layer to spread in a good manner.

In the semiconductor device illustrated in FIG. 2A, the thickness L12 of the insulating film 108 at the portion where the PN junction (for example, the interface between the second drift region 104 and the second base region 112) abuts the trench 107 is larger than the thickness L13 of the insulating film 108 between the second drift region 104 and the counter electrode. However, the thickness L12 may be the same or smaller than the thickness L13.

FIG. 2B is a view illustrating an edge trench 207 in the outermost edge portion of the semiconductor device and the structures around the edge trench 207. As illustrated in FIG. 2B, an insulating film 208 is formed inside the edge trench 207 in the outermost edge portion, and a counter electrode 209 insulated from the outside of the trench 207 by the insulating film 208 and a gate electrode 210 provided above the counter electrode 209 and insulated from the outside of the trench 207 by the insulating film 208 are formed. No source region may be provided on the side wall of the edge trench 207. Although the semiconductor device illustrated in FIG. 2B is provided with the counter electrode 209 and the gate electrode 210, the semiconductor device may have a structure including only one these, for example, a structure including only the counter electrode 209 or a structure including only the gate electrode 210. Moreover, the potential of the gate electrode 110 may be different from the potential of the gate electrode 210. The potential of the gate electrode 210 is the same as that of the source electrode 106, and the potential of the gate electrode 210 may be a floating potential. Moreover, the edge trench 207 may have the same shape as the trench 107 described in FIG. 2A.

The edge trench 207 may be formed to extend to a position below the first PN junction 121 (for example, the interface between the second drift region 104 and the second base region 112), and the thickness L22 of the insulating film 208 at a portion where the PN junction abuts the edge trench 207 may be larger than the thickness L21 of the insulating film 208 in a portion abutting the first base region 105 above the aforementioned portion. In the semiconductor device having such a structure, since the thickness of the insulating film on the trench side wall facing the corner of the lower portion of the gate electrode 110 is large, the electric field on the corner side of the lower portion of the gate electrode 110 is reduced. Accordingly, is possible to suppress breakdown at the corner in the lower portion of the gate electrode 110 when voltage of a predetermined level or more is applied and to improve the breakdown voltage of the semiconductor device.

Moreover, the thickness L22 of the insulating film 208 at the portion where the first PN junction 121 abuts the edge trench 207 may be larger than the thickness L12 of the insulating film 108 at the portion where the first PN junction 121 abuts the trench 107. The thickness L21 of the insulating film 208 in the portion abutting the first base region 105 may be larger than the thickness L11 of the insulating film 108 in a portion facing the channel region 100. Furthermore, the thickness L22 of the insulating film 208 at the portion where the first PN junction 121 abuts the edge trench 207, the thickness L12 of the insulating film 108 at the portion where the first PN junction 121 between the second drift region 104 and the second base region 112 abuts the trench 107, the thickness L21 of the insulating film 208 in the portion abutting the first base region 105, and the thickness L11 of the insulating film 108 in the portion facing the channel region 100 may be arranged to satisfy the following relationship in EQ(1):

$$L22>L12>L21>L11 \qquad \text{EQ(1)}$$

Setting the thickness L22 larger than the thickness L12 can prevent breakdown from occurring first in the edge trench.

Moreover, the thickness L13 of the insulating film in a portion between the counter electrode 109 in the trench 107 and the second drift layer 104 may be same as the thickness L23 of the insulating film in a portion between the counter electrode 209 in the edge trench 207 and the second drift electrode 104. In one or more embodiments, the thickness L13 of the insulating film in a portion between the counter electrode 109 in the trench 107 and the second drift layer 104 may be larger or smaller than the thickness L23 of the insulating film in a portion between the counter electrode 209 in the edge trench 207 and the second drift layer 104. Furthermore, the thickness D13 of the insulating film 108 from the lower surface of the counter electrode 109 in the trench 107 to the lower surface of the trench 107 may be smaller than the thickness D23 of the insulating film 208 from the lower surface of the counter electrode 209 in the trench 207 to the lower surface of the trench 207. Moreover, no base region 105 may be formed outside the edge trench 207.

FIG. 3A is a diagram illustrating a configuration of the gate electrode and the counter electrode in the trench according to one or more alternative or additional embodiments. A lower surface of a gate electrode 110A illustrated in FIG. 3A is located below the first PN junction (for example, the interface between the second drift region 104 and the second base region 112), that is the gate electrode 110A extends to the second drift region 104. The thickness of the insulating film 108 at the portion where the first PN junction abuts the trench 107 may be larger than the thickness of the insulating film 108 in the portion facing the channel region 100. The gate electrode 110A illustrated in FIG. 3A has a shape abruptly narrowed in a depth direction from a portion near the PN junction. In the semiconductor device having such a structure, since the thickness of the insulating film on the trench side wall facing the corner of the lower portion of the gate electrode 110 is large, the electric field on the corner side of the gate electrode lower portion is reduced. Accordingly, it is possible to suppress breakdown at the corner of the gate electrode lower portion when voltage of a predetermined level or more is applied and to improve the breakdown voltage of the semiconductor device.

FIG. 3B is a view for explaining configurations of the gate electrode and the counter electrode in the trench according to one or more alternative or additional embodiments. A lower surface of a gate electrode 110B illustrated in FIG. 3B is located below the PN junction (for example, the interface between the second drift region 104 and the second base region 112), that is the gate electrode 110B extends to the second drift region 104. The thickness of the insulating film 108 at the portion where the PN junction abuts the trench 107 may be larger than the thickness of the insulating film 108 in the portion facing the channel region 100. The gate electrode 110B illustrated in FIG. 3B has a shape abruptly narrowed in a depth direction from a portion near the PN junction while curving, and a lower surface thereof has a curved shape. In the semiconductor device having such a structure, since the thickness of the insulating film on the trench side wall facing the corner of the lower portion of the gate electrode 110 is large, the electric field on the corner side of the gate electrode lower portion is reduced. Accordingly, it is possible to suppress breakdown at the corner of the gate electrode lower portion when voltage of a predetermined level or more is applied and to improve the breakdown voltage of the semiconductor device.

FIG. 3C is a view for explaining configurations of the gate electrode and the counter electrode in the trench according to one or more alternative or additional embodiments. A lower surface of a gate electrode 110C illustrated in FIG. 3C is located below the PN junction (for example, the interface between the second drift region 104 and the second base region 112), that is the gate electrode 110C extends to the second drift region 104. The thickness of the insulating film 108 at the portion where the PN junction abuts the trench 107 may be larger than the thickness of the insulating film 108 in the portion facing the channel region 100. The gate electrode 110C illustrated in FIG. 3C includes a large width portion including an upper surface of the gate electrode 110C and a small width portion including a lower surface of the gate electrode 110C and has a so-called T-shape in which the width of the large width portion is larger than that of the small width portion. The width L14 of the small width portion of the gate electrode 110C may be larger than the width L15 of an upper surface portion of the counter electrode 109. Moreover, the thickness L12 of the insulating film 108 at the portion where the PN junction abuts the trench 107 may be the same or smaller than the thickness L13 of the insulating film in the portion between the counter electrode 109 and the second drift region 104.

FIG. 3D is a view for explaining configurations of the gate electrode and the counter electrode in the trench according to one or more alternative or additional embodiments. A lower surface of a gate electrode 110D illustrated in FIG. 3D is located below the PN junction (for example, the interface between the second drift region 104 and the second base region 112), that is the gate electrode 110D extends to the second drift region 104. The thickness of the insulating film 108 at the portion where the PN junction abuts the trench 107 may be larger than the thickness of the insulating film 108 in the portion facing the channel region 100. A trench 107 illustrated in FIG. 3D may extend substantially vertically in the depth direction of the semiconductor device. A trench 107 illustrated in FIG. 3D may extend substantially vertically in the depth direction of the semiconductor device. In other words, the trench 107 may extend substantially vertically to a semiconductor substrate (not illustrated). Similarly, the counter electrode 109A illustrated in FIG. 3D may extend substantially vertically in the depth direction of the semiconductor device. In other words, the counter electrode 109A may extend substantially vertically to a semiconductor substrate (not illustrated).

Figure 4:
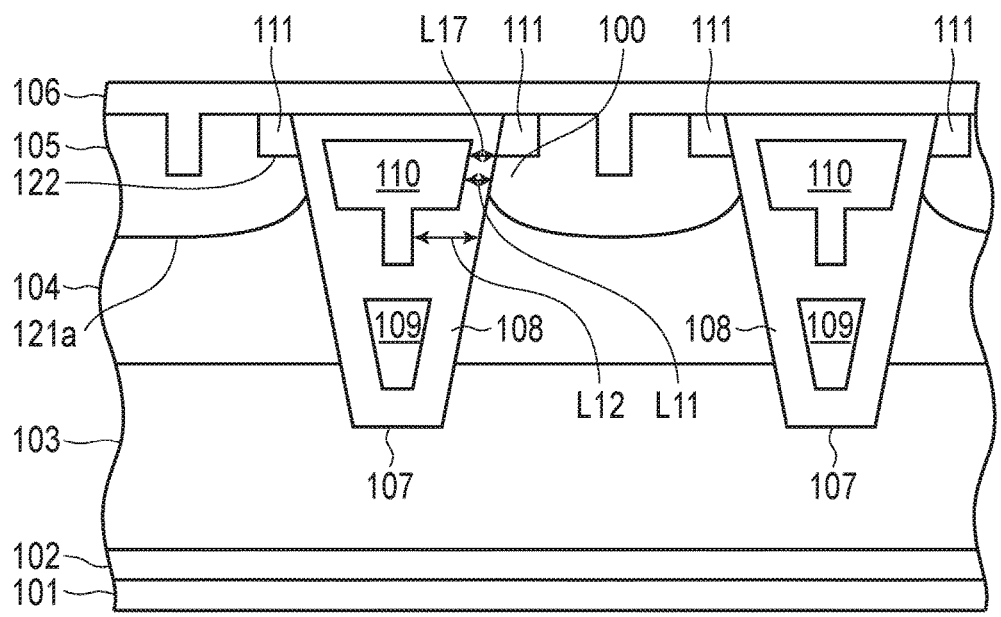
FIG. 4 is a diagram illustrating a cross-sectional view of a trench cross-sectional view of a trench configuration of an integrated power semiconductor device having an improved trench depth, a gate electrode and a source electrode according to one or more embodiments.

FIG. 4 is a diagram illustrating a cross-sectional view of a trench cross-sectional view of a trench configuration of an integrated power semiconductor device having an improved trench depth, a gate electrode and a source electrode according to one or more embodiments. The semiconductor device includes a drain electrode 101, a drain region 102 provided on the drain electrode 101, a first drift region 103 provided on the drain region 102, a second drift region 104 provided on the first drift region 103, a first base region 105 provided on the second drift region 104, a source electrode 106 provided on the first base region 105, trenches 107 formed to abut the first base region 105, the second drift region 104, and the first drift region 103, an insulating film 108 provided in the trenches 107, counter electrodes 109 insulated from outside of the trenches 107 by the insulating film 108, gate electrodes 110 provided above the counter electrodes 109 and insulated from the outside of the trenches 107 by the insulating film 108, source regions 111 abutting the first base region 105 and the trenches 107. Compared with the semiconductor device according to one or more embodiments illustrated in FIG. 1, the semiconductor device illustrated in FIG. 4 has no second base regions, and the first PN junction 121a is curved toward the source region 111. The thickness of the insulating film 108 at a deeper portion where the first PN junction 121a abuts the trench 107 may be larger than the thickness L17 of the insulating film in a portion facing a second PN junction 122. The thickness L12 of the insulating film 108 that is the substantially same depth as the deepest portion of the first PN Junction 121a is larger than the thickness L11 of the insulating film 108 in a portion facing the channel region 100. Furthermore, the thickness L12 of the insulating film 108 is larger than the thickness L17 of the insulating film 108 in a portion facing a second PN junction 122. The lower surface of the gate electrode 110 may be positioned below the deepest portion of the first PN Junction 121a.

As describe above, the semiconductor device according to one or more embodiments may reduce the on-resistance while securing a sufficient level of withstanding voltage. In the MOS transistor disclosed in the prior art document 1, there is a possibility that, when voltage of a certain level or higher is applied in an off state of the MOS transistor, an electric field concentration point moves from a trench end to corner of a gate electrode lower portion and breakdown occurs at the corner of the gate electrode lower portion.

The prior art document 1 teaches away from the semiconductor device according to one or more embodiments. Specifically, it has been conventionally considered preferable to set the thickness of the insulating layer at the portion facing the PN junction between the source region and the base region substantially equal to the thickness of the insulating film the portion facing the PN junction between the drift region and the base region in order to generate the channel region in a good manner.

In the semiconductor device according to one or more embodiments, the thickness of the insulating film at the portion facing the PN junction between the drift region and the base region is changed, that is, the thickness of the insulating film at the portion facing the PN junction between the drift region and the base region and the thickness of the insulating layer at the portion facing the PN junction between the source region and the base region are varied, specifically, the thickness of the insulating film at the portion facing the PN junction between the drift region and the base region is set to be larger than the thickness of the insulating layer at the portion facing the PN junction between the source region and the base region. This can reduce the on-resistance while securing a sufficient level of withstanding voltage.

Although one or more embodiments as described above herein may be directed to devices having a particular arrangement of layers with conductivity types, e.g. N, N+, P, and so on, other embodiments may be directed to devices in which the conductivity types are reversed or otherwise modified. Furthermore, the above-described aspects may be combined with each other as practicable within the contemplated scope of embodiments. Above described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

The invention claimed is:

1. A semiconductor device comprising:
    a drain region;
    a drift region positioned on the drain region;
    a base region positioned on the drift region;
    a trench positioned to abut the base region and the drift region;
    an insulating film in the trench;
    a counter electrode embedded in the insulating film;
    a gate electrode positioned above the counter electrode and that is embedded in the insulating film; and
    a source region that abuts the base region and the trench, wherein
    a thickness of the insulating film between the gate electrode and an interface between the drift region and the base region is larger than a thickness of the insulating film between the gate electrode and an interface between the source region and the base region, and
    the drift region comprises:
        a first drift region; and
        a second drift region positioned on the first drift region and has concentration of impurity is higher than that of the first drift region.

2. The semiconductor device according to claim 1, wherein the trench has a narrow shape as a depth direction from the base region to the drain region.

3. The semiconductor device according to claim 1, wherein a lower surface of the counter electrode is arranged below an interface between the first drift region and the second drift region.

4. The semiconductor device according to claim 1, wherein a width of a lower surface of the gate electrode is smaller than a width of an upper surface of the counter electrode.

5. The semiconductor device according to claim 1, wherein
    the gate electrode comprises:
        a large width portion that includes an upper surface of the gate electrode; and
        a small width portion that abuts the large width portion and that includes a lower surface of the gate electrode, wherein
    a width of the large width portion is larger than a width of the small width portion.

6. The semiconductor device according to claim 5, wherein the width of the small width portion is larger than a width of an upper surface of the counter electrode.

7. The semiconductor device according to claim 6, wherein an interface between the large width portion and the small width portion is provided above an interface between the drift region and the base region in a depth direction.

8. The semiconductor device according to claim 5, wherein a shape of the large width portion is a trapezoidal shape and a shape of the small width portion is a rectangular shape.

9. The semiconductor device according to claim 5, wherein a length of the large width portion in a depth direction is equal to or larger than a length of the small width portion in the depth direction.

10. The semiconductor device according to claim 1, further comprising an edge trench positioned in an outermost edge portion of the semiconductor device and that is formed to abut the base region and the drift region, wherein
    the edge trench comprises:
        an insulating film in the trench;
        a counter electrode embedded in the insulating film in the edge trench; and
        a gate electrode positioned above the counter electrode and that is embedded in the insulating film in the edge trench.

11. The semiconductor device according to claim 10, wherein a thickness of the insulating film in the edge trench at a portion where the interface between the drift region and the base region abuts the edge trench is larger than a thickness of the insulating film in the trench at a portion where the interface between the drift region and the base region abuts the trench.

12. The semiconductor device according to claim 10, wherein a thickness of the insulating film in the edge trench in a portion abutting the base region is larger than a thickness of the insulating film in the trench in a portion which faces a channel region.

13. The semiconductor device according to claim 1, wherein a shape of the gate electrode is abruptly narrowed in a depth direction from a portion near the interface between the drift region and the base region.

14. The semiconductor device according to claim 1, wherein the gate electrode is abruptly narrowed in a depth direction from a portion near the interface between the drift region and the base region and a shape of a lower surface of the gate electrode is curved.

15. A semiconductor device comprising:
    a drain region;
    a drift region positioned on the drain region;
    a base region positioned on the drift region;
    a trench positioned to abut the base region and the drift region;

an insulating film in the trench;
a counter electrode embedded in the insulating film;
a gate electrode positioned above the counter electrode and that is embedded in the insulating film; and
a source region that abuts the base region and the trench, wherein
a thickness of the insulating film between the gate electrode and an interface between the drift region and the base region is larger than a thickness of the insulating film between the gate electrode and an interface between the source region and the base region, and
an interface between a first drift region and a second drift region is arranged below a lower surface of the gate electrode.

16. A semiconductor device comprising:
a drain region;
a drift region positioned on the drain region;
a base region positioned on the drift region;
a trench positioned to abut the base region and the drift region;
an insulating film in the trench;
a counter electrode embedded in the insulating film;
a gate electrode positioned above the counter electrode and that is embedded in the insulating film; and
a source region that abuts the base region and the trench, wherein
a thickness of the insulating film between the gate electrode and an interface between the drift region and the base region is larger than a thickness of the insulating film between the gate electrode and an interface between the source region and the base region, and
the base region comprises:
a first base region; and
a second base region positioned to abut the trench and the drift region and whose concentration of impurity is lower than the first base region.

* * * * *